US012183853B2

United States Patent
Ikeda et al.

(10) Patent No.: US 12,183,853 B2
(45) Date of Patent: Dec. 31, 2024

(54) LED MODULE, METHOD FOR MANUFACTURING LED MODULE, AND CIRCUIT BOARD

(71) Applicant: Japan Display Inc., Tokyo (JP)

(72) Inventors: Masanobu Ikeda, Tokyo (JP); Yoshinori Aoki, Tokyo (JP); Akihiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 584 days.

(21) Appl. No.: 17/444,071

(22) Filed: Jul. 30, 2021

(65) Prior Publication Data

US 2022/0045242 A1 Feb. 10, 2022

(30) Foreign Application Priority Data

Aug. 4, 2020 (JP) .................. 2020-132462

(51) Int. Cl.
*H01L 33/38* (2010.01)
*H01L 33/00* (2010.01)
*H01L 33/62* (2010.01)

(52) U.S. Cl.
CPC ............ *H01L 33/38* (2013.01); *H01L 33/005* (2013.01); *H01L 33/62* (2013.01); *H01L 2933/0016* (2013.01); *H01L 2933/0066* (2013.01)

(58) Field of Classification Search
CPC ....... H01L 33/38; H01L 33/005; H01L 33/62; H01L 2933/0016; H01L 2933/0066;
(Continued)

(56) References Cited

U.S. PATENT DOCUMENTS 7,554,126 B2 * 6/2009 Higashi .................. H01L 33/38
 438/22
7,816,704 B2 * 10/2010 Hsu .......................... H01L 33/60
 438/678
(Continued)

FOREIGN PATENT DOCUMENTS

CN 109599409 A 4/2019
CN 111063779 A 4/2020
(Continued)

OTHER PUBLICATIONS

Office Action issued on Mar. 26, 2024, in corresponding Japanese Application No. 2020-132462, 10 pages.
(Continued)

*Primary Examiner* — Kyoung Lee
*Assistant Examiner* — Sophia W Kao
(74) *Attorney, Agent, or Firm* — Maier & Maier, PLLC

(57) ABSTRACT

An LED module includes a first electrode and a second electrode disposed on the substrate, an LED chip disposed on the first electrode and the second electrode, and a first bump between the LED chip and the first electrode, and a second bump between the LED chip and the second electrode. The LED chip includes a cathode electrode facing the first electrode, an anode electrode facing the second electrode, and a step portion between the cathode electrode and the anode electrode, a distance between the first electrode and the cathode electrode is larger than a distance between the second electrode and the anode electrode, and the first bump is disposed to embed the step portion.

3 Claims, 16 Drawing Sheets

(58) Field of Classification Search
CPC ............... H01L 24/10; H01L 2224/11; H01L 2224/13; H01L 2224/1403; H01L 2224/16225; H01L 25/167; H01L 21/67144; G09F 9/33

See application file for complete search history.

(56) References Cited

U.S. PATENT DOCUMENTS

| | | | |
|---|---|---|---|
| 8,816,386 B2 * | 8/2014 | Chen | H01L 33/387 257/E33.056 |
| 10,186,549 B1 | 1/2019 | Cheung et al. | |
| 10,446,714 B2 | 10/2019 | Fujii et al. | |
| 2005/0110161 A1 | 5/2005 | Naito et al. | |
| 2006/0169994 A1 | 8/2006 | Tu et al. | |
| 2014/0124920 A1 | 5/2014 | Chuang et al. | |
| 2014/0186979 A1 | 7/2014 | Tu et al. | |
| 2015/0123160 A1 * | 5/2015 | Hsu | H01L 25/0753 257/99 |
| 2016/0381751 A1 * | 12/2016 | Bong | F21K 9/20 315/193 |
| 2020/0161499 A1 | 5/2020 | Ota et al. | |
| 2020/0176655 A1 | 6/2020 | Iguchi et al. | |

FOREIGN PATENT DOCUMENTS

| | | | |
|---|---|---|---|
| JP | 2003273148 A | | 9/2003 |
| JP | 2005136399 A | | 5/2005 |
| JP | 3746719 B2 | * | 2/2006 |
| JP | 2006216933 A | | 8/2006 |
| JP | 201223328 A | | 2/2012 |
| JP | 201962199 A | | 4/2019 |
| TW | 200836365 A | | 9/2008 |

OTHER PUBLICATIONS

Combined Taiwanese Office Action and Search Report issued May 3, 2022, in corresponding Taiwanese Patent Application No. 110126837 (English Translation only), 8 pages.

'English machine translation of Office Action dated Sep. 20, 2024, issued in CN Application No. 202110828554.0, 12 pages.

* cited by examiner

LED MODULE, METHOD FOR MANUFACTURING LED MODULE, AND CIRCUIT BOARD

CROSS-REFERENCE TO RELATED APPLICATIONS

This application is based upon and claims the benefit of priority from the prior Japanese Patent Application No. 2020-132462, filed on Aug. 4, 2020, the entire contents of which are incorporated herein by reference.

FIELD

An embodiment of the present invention relates to an LED module in which light emitting diodes (LEDs) are disposed, a display device in which LEDs are mounted on pixels, and a circuit board for mounting the LEDs.

BACKGROUND

A micro LED display in which micro light emitting diodes called micro LEDs are mounted on each of a plurality of pixels disposed in a matrix is known. The micro LED display has a structure in which the micro LEDs individually separated from a wafer are mounted on a substrate on a circuit that is called a backplane. As a result, the micro LED has a problem whereby the effect of non-radiative recombination generated at the side wall of the active layer cannot be neglected, and the luminous efficiency is reduced.

A flip chip type micro LED is disclosed in which light is extracted through a transparent sapphire substrate to enhance light extraction efficiency (refer to U.S. patent Ser. No. 10/446,714). A flip chip type micro LED is also disclosed that has a passivation film on the side wall of the active layer to prevent non-radiative recombination (refer to U.S. Patent Publication No. 2020/0161499).

The flip chip LED differs in the height of the cathode electrode and anode electrode. The conventional micro LED has a bump on the cathode electrode side thicker than a bump on the anode electrode side. In contrast, a flip-chip LED is disclosed having a planar electrode structure in which a groove is formed through the p-type semiconductor layer and the active layer to reach the n-type semiconductor layer (refer to Chinese Patent Publication No. 111063779). A micro LED is also disclosed in which a cathode electrode has a shape to rest over a step portion between an n-type semiconductor layer and a p-type semiconductor layer, and a connection portion with a bump is provided on the p-type semiconductor layer (refer to Japanese Unexamined Patent Publication No. 2020-088383).

SUMMARY

An LED module in an embodiment according to the present invention includes a first electrode and a second electrode disposed on the substrate, an LED chip disposed on the first electrode and the second electrode, and a first bump between the LED chip and the first electrode, and a second bump between the LED chip and the second electrode. The LED chip includes a cathode electrode facing the first electrode, an anode electrode facing the second electrode, and a step portion between the cathode electrode and the anode electrode, a distance between the first electrode and the cathode electrode is larger than a distance between the second electrode and the anode electrode, and the first bump is disposed to embed the step portion.

A display device in an embodiment according to the present invention includes a first electrode and a second electrode disposed on a pixel, at least one LED chip disposed on the first electrode and the second electrode, and a first bump between the at least one LED chip and the first electrode, and a second bump between the at least one LED chip and the second electrode. The at least one LED chip includes a cathode electrode facing the first electrode, an anode electrode facing the second electrode, and a step portion between the cathode electrode and the anode electrode, a distance between the first electrode and the cathode electrode is larger than a distance between the second electrode and the anode electrode, and the first bump is disposed to embed the step portion.

A method for manufacturing LED module in an embodiment according to the present invention includes forming a first bump on a first electrode and a second bump on a second electrode on a substrate, disposing an LED chip on the first bump and the second bump, and heating the first bump and the second bump to electrically connect the LED chip to the first electrode and the second electrode. The LED chip has a step portion on a surface facing the first bump and the second bump, and the first bump is formed to fill the step portion.

A method for manufacturing LED module in an embodiment according to the present invention includes forming a first bump on a first electrode and a second bump on a second electrode on a pixel, disposing an LED chip on the first bump and the second bump, and heating the first bump and the second bump to electrically connect the LED chip to the first electrode and the second electrode. The LED chip has a step portion on a surface facing the first bump and the second bump, and the first bump is formed to fill the step portion.

A circuit board in an embodiment according to the present invention includes a first electrode for connecting a cathode electrode of an LED, a second electrode for connecting an anode electrode of the LED, a first bump disposed on the first electrode, and a second bump disposed on the second electrode. The shapes of the first bump and the second bump are different.

DESCRIPTION OF EMBODIMENTS

Figure 1A:
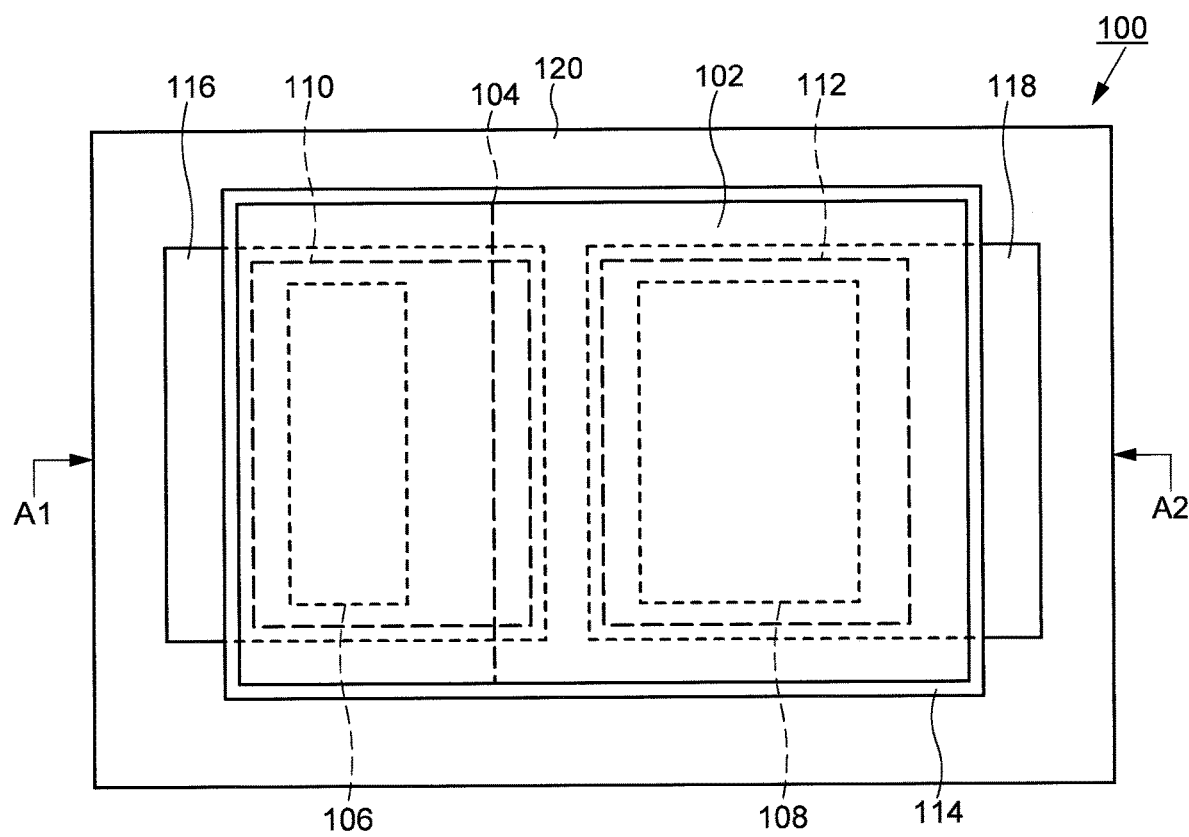
FIG. 1A shows a plan view of an LED module according to an embodiment of the present invention.

Hereinafter, embodiments of the present invention will be described with reference to the drawings and the like. The present invention may be carried out in various forms without departing from the gist thereof, and is not to be construed as being limited to any of the following embodiments. Although the drawings may schematically represent the width, thickness, shape, and the like of each part in comparison with the actual embodiment in order to clarify the description, they are merely examples and do not limit the interpretation of the present invention. In the present specification and each of the figures, elements similar to those described above with respect to the figures mentioned above are designated by the same reference numerals (or numbers followed by a, b, etc.), and a detailed description thereof may be omitted as appropriate. Furthermore, the characters "first" and "second" appended to each element are convenient signs used to distinguish each element, and have no further meaning unless specifically described.

As used herein, where a member or region is "on" (or "below") another member or region, this includes cases where it is not only directly on (or just under) the other member or region but also above (or below) the other member or region, unless otherwise specified. That is, it includes the case where another component is included in between above (or below) other members or regions.

In an embodiment of the present invention, a micro LED refers to a chip having a chip size of several micrometers or more, 100 μm or less, and a mini LED is a chip having a chip size of 100 μm or more. An embodiment of the present invention may be used with LEDs of any size and may be suitably used in accordance with the application and form of the LED module.

1. Structure of the LED Module

The structure of the LED module according to an embodiment of the present invention will be described. Hereinafter, the structure of a bump that electrically connects the LED chip and a pad disposed on a substrate will be described.

(1) Mounting Structure of the LED Chip

Figure 1B:
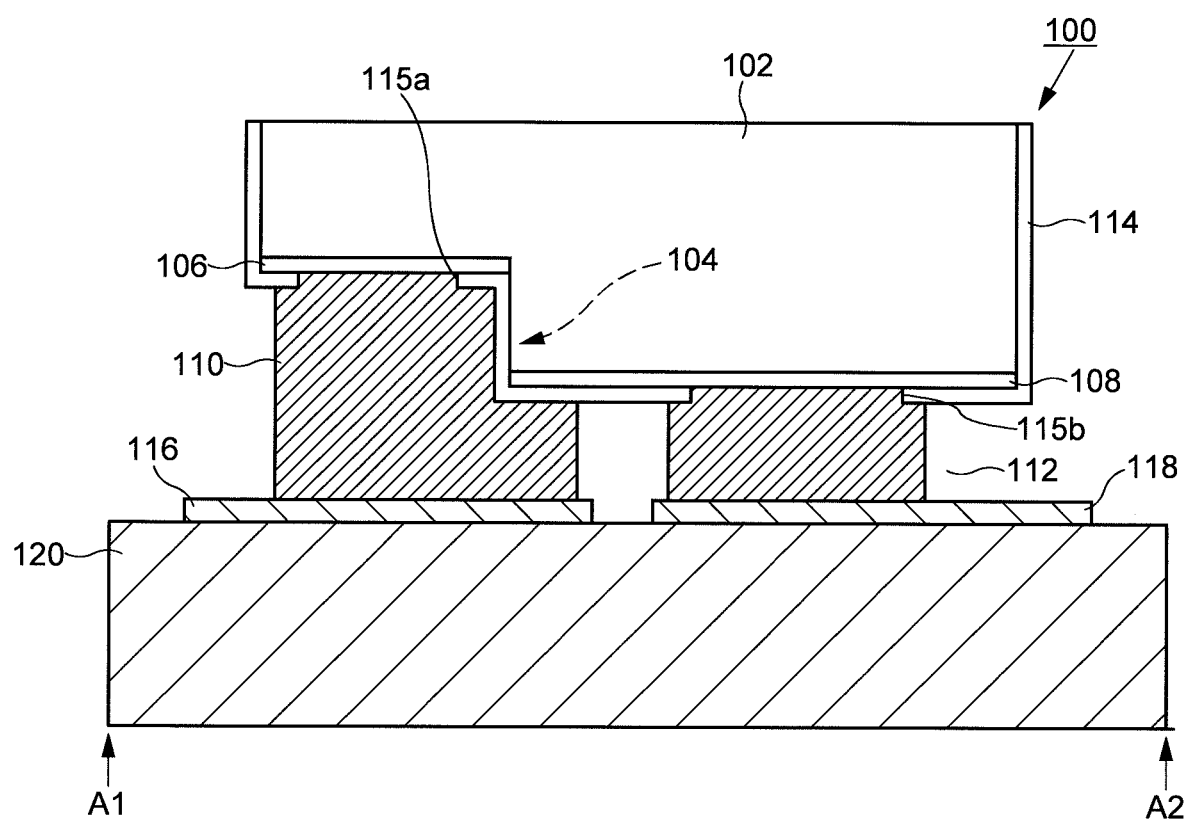
FIG. 1B is a cross-sectional view of the LED module according to an embodiment of the present invention, and shows a configuration corresponding to A1-A2 shown in FIG. 1A.

FIG. 1A and FIG. 1B show the configuration of the LED module 100 according to one embodiment of the present invention. FIG. 1A shows a plan view of an LED module 100 mounted on a substrate 120. FIG. 1B shows a cross-sectional view corresponding to A1-A2 shown in FIG. 1A.

A LED chip 102 is a two-terminal element having a cathode electrode 106 and an anode electrode 108 and is flip-chip mounted on the substrate 120 by a first bump 110 and a second bump 112. The substrate 120 is disposed with a first electrode 116 and a second electrode 118 corresponding to the cathode electrode 106 and the anode electrode 108 of the LED chip 102. The first bump 110 is disposed corresponding to the cathode electrode 106 of the LED chip 102 and the second bump 112 is disposed corresponding to the anode electrode 108.

Although not shown in detail in FIG. 1B, the LED chip 102 has a structure in which an n-type semiconductor layer, an active layer, and a p-type semiconductor layer are laminated. A passivation film 114 may be provided on the side of the LED chip 102 to prevent surface recombination. Passivation film 114 is also formed on the cathode electrode 106 and the anode electrode 108. Therefore, the passivation film 114 is formed with a first opening 115a that exposes the cathode electrode 106 and a second opening 115b that exposes the anode electrode 108. The first bump 110 and the cathode electrode 106 are connected via the first opening 115a, and the second bump 112 and the anode electrode 108 are connected via the second opening 115b.

As shown in FIG. 1B, the LED chip 102 differs in height between the cathode electrode 106 and the anode electrode 108. Since the cathode electrode 106 is provided in an area where a portion of the semiconductor layer (the p-type semiconductor layer, the active layer) is removed, a step portion 104 is formed between the cathode electrode 106 and the anode electrode 108. When the LED chip 102 is mounted, the distance between the first electrode 116 and the cathode electrode 106 is larger than the distance between the second electrode 118 and the anode electrode 108.

The LED chip 102 is formed so that the area of the cathode electrode 106 is as small as possible in order to increase as much as possible the area of the light emitting region (the area of the active layer). On the other hand, in order to form a stable mounting structure on the substrate 120, it is preferred that the first bump 110 on the cathode side and the second bump 112 on the anode side be as large as possible.

The LED module 100 according to this embodiment has a structure in which the first bump 110 on the cathode side is disposed beyond the step portion 104 of the LED chip 102 and the step portion 104 is embedded, as shown in FIG. 1A and FIG. 1B. The LED chip 102 is disposed so that the first bump 110 and the second bump 112 have the same height. The LED chip 102 may also be formed such that the width of the first bump 110 is greater than the width of the second bump 112. By forming the first bump 110 with such a shape, the LED chip 102 can form a stable connection. That is, since the first bump 110 has a shape so as to embed the step portion 104, the LED chip 102 can be mounted horizontally. In other words, since the first bump 110 has regions having different thicknesses, the width of the first bump 110 can be widened, and the LED chip 102 can be stably mounted on the substrate 120 while being held in a horizontal state. Further, since the first bump 110 is formed so as to fill the step portion 104, the LED chip 102 can be mounted on the substrate in a stable state.

In order to form the bump having a different thickness so as to fill the step portion 104 of the LED chip 102, it is necessary to form a region having a different thickness in one bump. However, it is not appropriate to form a bump of different thicknesses or cut a part of the bumps, because the number of processes increases, and machining becomes difficult. Therefore, in the present embodiment, the bump is formed by using a solder having a low melting point, and this problem is solved by utilizing the characteristic thereof. That is, the first bump 110 has a shape including regions having different thicknesses so as to embed the step portion 104 as shown in FIG. 1B, by devising the initial shape of the bump by utilizing the soft property of the solder having a low melting point.

(2) Structure of Bumps

Figure 2A:
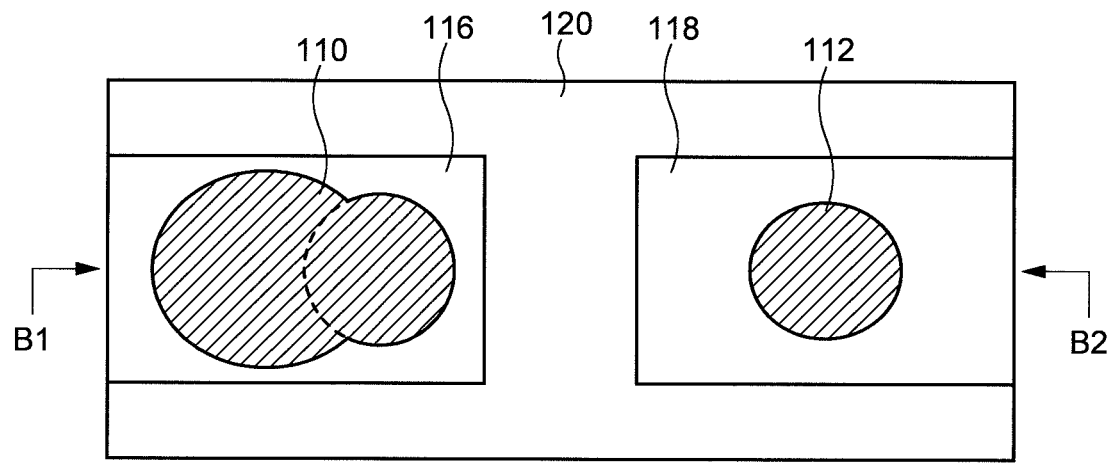
FIG. 2A shows a plan view of a bump of an LED module according to an embodiment of the present invention.
Figure 2B:
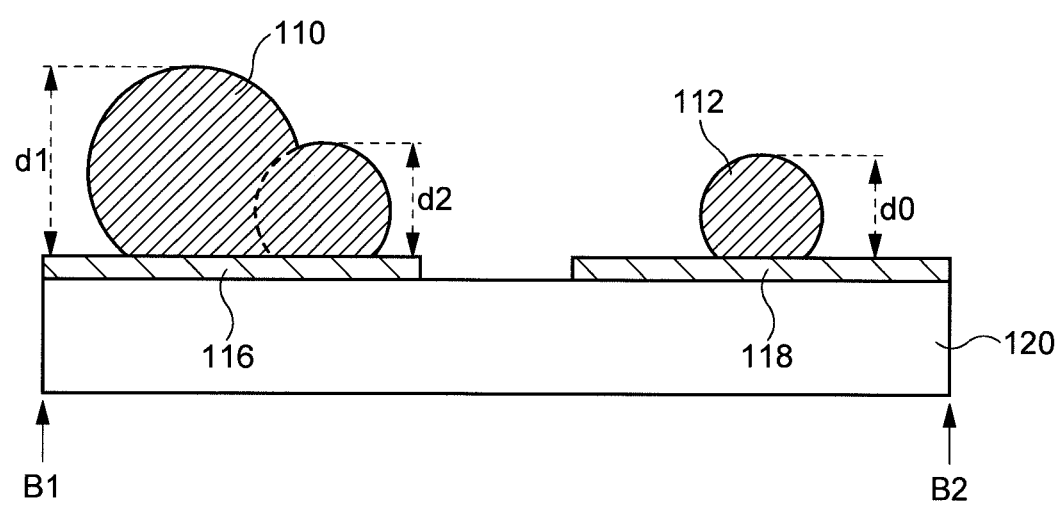
FIG. 2B is a cross-sectional view of the LED module according to an embodiment of the present invention and shows a configuration corresponding to B1-B2 shown in FIG. 2A.

FIG. 2A and FIG. 2B show the initial structures (before the LED chip 102 is mounted) of the first bump 110 and the second bump 112 according to the present embodiment. FIG. 2A shows a plan view of each of the initial structures of the first bump 110 and second bump 112 formed on the first electrode 116 and second electrode 118. FIG. 2B shows a cross-sectional structure corresponding to B1-B2 shown in FIG. 2A.

As shown in FIG. 2A and FIG. 2B, the first bump 110 is formed on the first electrode 116 and the second bump 112 is formed on the second electrode. The second bump 112 is shaped to have one spherical surface, whereas the first bump 110 has a shape fused with two spherical (or hemispherical) bodies of different sizes. Alternatively, the first bump 110 has a shape that includes a region of thickness d1 and a region of thickness d2 while having a spherical surface. The thickness d1 is larger than the thickness d2 (d1>d2).

The first bump 110 corresponds to the region of the LED chip 102 in which the region of the thickness d1 corresponds to the region of the lower side of the step portion 104 and the region of the thickness d2 corresponds to the region of the higher side of the step portion 104. Accordingly, the first bump 110 is formed with the region of thickness d2 near the first bump 110, and the region of thickness d1 is formed away from the first bump 110. The thickness d0 of the second bump 112 is smaller than d1 and may be similar to d2.

The first bump 110 and second bump 112 are heated and fluidized when mounting the LED chip 102 to change the shape shown in FIG. 2A and FIG. 2B to the shape shown in FIG. 1B. The first bump 110 having an initial structure in which hemispherical bodies are fused as shown in FIG. 2A, can form a bump across the step portion 104 of the LED chip 102, and can form the bump including regions having different thicknesses. That is, by allowing the initial structure of the first bump 110 to include regions of different thickness as shown in FIG. 1B, the first bump 110 may have regions of different thickness and may be shaped with step portions 104 embedded to extend toward the anode electrode 108.

Figure 3A:
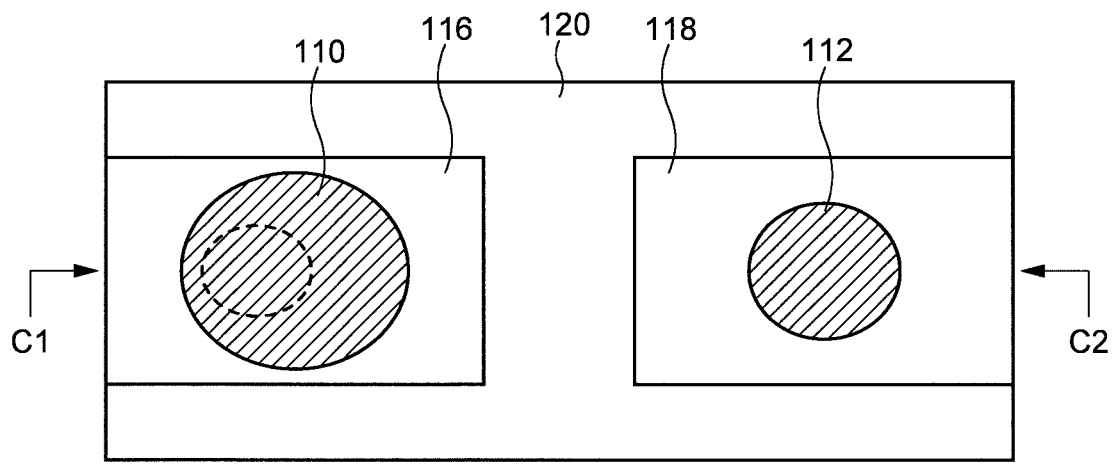
FIG. 3A shows a plan view of a bump of an LED module according to an embodiment of the present invention.
Figure 3B:
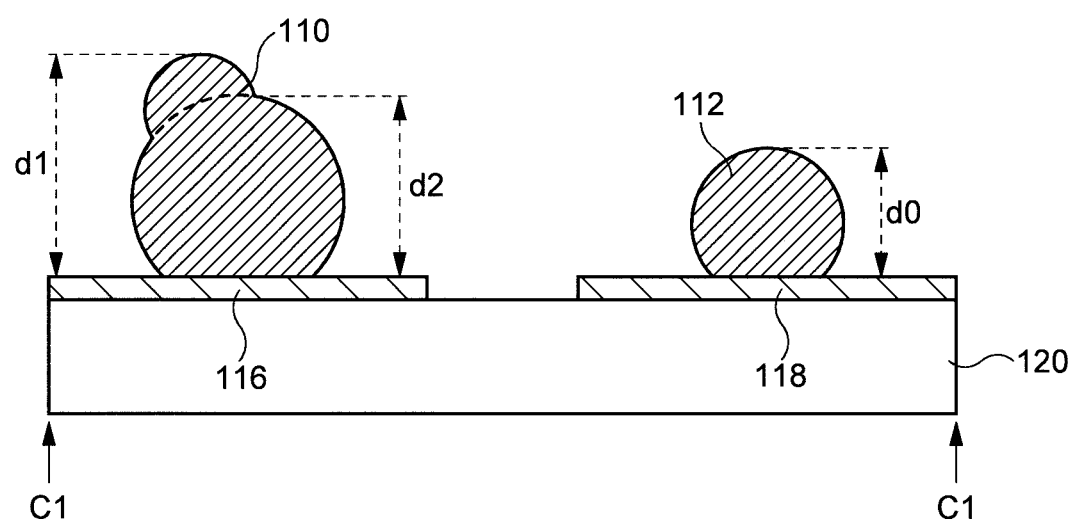
FIG. 3B is a cross-sectional view of the LED module according to an embodiment of the present invention and shows a configuration corresponding to C1-C2 shown in FIG. 3A.

FIG. 3A and FIG. 3B show another aspect of the initial structure of the first bump 110 and second bump 112. FIG. 3A shows a plan view of each of the initial structures of the first bump 110 and second bump 112 formed on the first electrode 116 and second electrode 118. FIG. 3B shows a cross-sectional structure corresponding to C1-C2 shown in FIG. 3A.

FIG. 3A and FIG. 3B show a structure in which bumps of different sizes are laminated such that the first bump 110 includes regions of different thickness. That is, the first bump 110 has a shape in which a plurality of structures having a spherical surface are partially laminated so that portions on the side of the cathode electrode 106 can be embedded in accordance with the step portion 104 of the LED chip 102. In other words, the first bump 110 has an initial structure disposed such that a second structure having a spherical surface extends over the first structure having a spherical surface. The first bump 110 includes a region of thickness d1 and a region of thickness d2 that is small relative to thickness d1. Here, the region of thickness d1 is disposed at a position far from the second bump 112, and the region of thickness d2 is disposed at a position close to the second bump 112.

The first bump 110 having an initial structure as shown in FIG. 3A and FIG. 3B can also form a bump that extends over the step portion 104 of the LED chip 102, thereby forming a bump including regions having different thicknesses. That is, by forming the initial structure of the first bump 110 to include regions having different thicknesses, it is possible to provide the first bump 110 having regions having different thicknesses as shown in FIG. 1B and a shape in which the step portion 104 extends toward the embedded anode electrode 108.

Figure 4A:
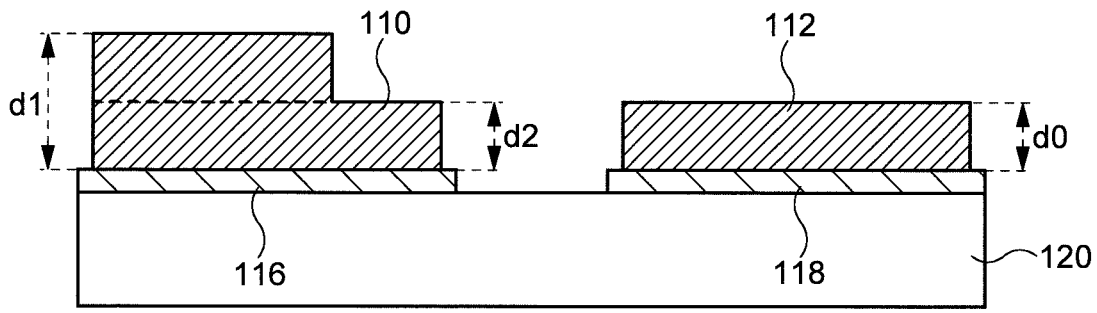
FIG. 4A shows a cross-sectional structure of a bump of an LED module according to an embodiment of the present invention.

FIG. 4A shows a shape in which the first bump 110 has a stepped shape and the second bump 112 has no stepped shape. The stepped shape of the first bump 110 has a shape corresponding to the step portion 104 of the LED chip 102. The first bump 110 has a region of thickness d1 and a region of thickness d2 (d1>d2), and this difference in film thickness (d1−d2) has a value corresponding to the height of the step portion 104. That is, the first bump 110 has an initial structure in which the high side of the step is positioned away from the second bump 112 and the low side of the step is positioned near the second bump 112.

The thickness d0 of the second bump 112 has the same thickness as the region of the thickness d2 of the first bump. The LED chip 102 can be mounted on the substrate 120 as shown in FIG. 1B, by using first bumps 110 and second bumps 112 having such initial shapes.

Figure 4B:
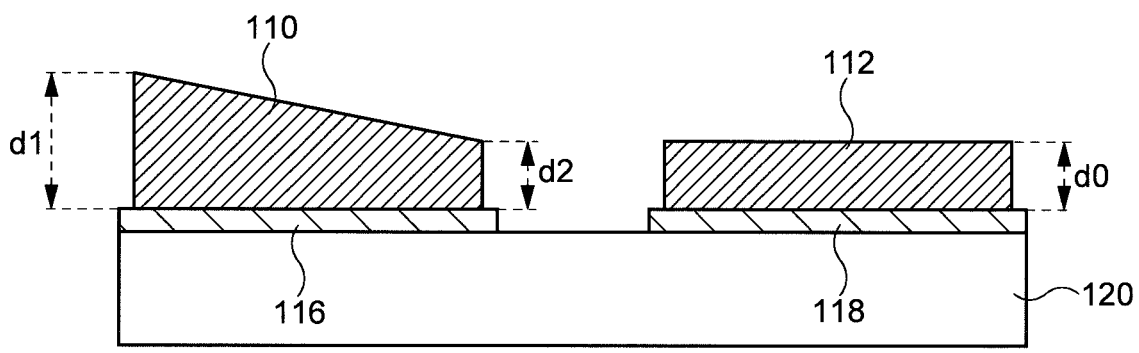
FIG. 4B shows a cross-sectional structure of a bump of an LED module according to an embodiment of the present invention.

FIG. 4B shows a shape in which the upper surface of the first bump 110 is inclined. The first bump 110 has a shape in which the thickness decreases continuously from d1 to d2 from one end of the outer side to one end of the inner side in a cross-sectional view. The thickness d2 of the first bump 110 is the same as the thickness d0 of the second bump 112. According to the shape of the first bump 110, the step portion 104 of the LED chip 102 can be embedded with an increase in its volume by including an area where the film thickness increases from d2 to d1. The initial structure of the first bumps 110 and the second bumps 112 shown in FIG. 4B also allows for the shape of the first bumps 110 and the second bumps 112 as shown in FIG. 1B, by promoting fluidization by heat treatment when mounting the LED chips 102.

Figure 4C:
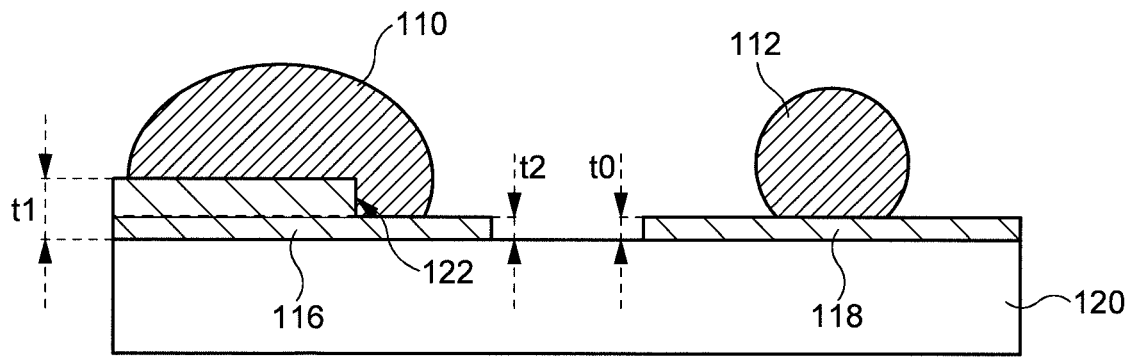
FIG. 4C shows a cross-sectional structure of a bump of an LED module according to an embodiment of the present invention.

FIG. 4C shows a structure in which a step portion 122 is provided in the first electrode 116. The first bump 110 overlaps the step portion 122 of the first electrode 116 and is provided to embed the step portion 122. The first electrode 116 has a region of the film thickness t1 and a region of the film thickness t2 smaller than this region (t1>t2) and has a step portion 122 formed by the difference in the film thickness. The step portion 122 of the first electrode 116 is disposed at a position where the step portion 122 engages with the step portion 104 of the LED chip 102 mounted thereon. The first bump 110 is raised by the step portion 122 of the first electrode 116 to obtain an equivalent structure when the film thickness is substantially increased. The step portion 122 of the first electrode 116 may be formed by laminating a conductive film. The use of a first bump 110 having an initial shape as shown in FIG. 4C may also form a bump across the step portion 104 of the LED chip 102 to form a bump comprising regions of different thickness.

2. Method of Manufacturing LED Module

A method of manufacturing the LED module 100 according to an embodiment of the present invention will be described. Hereinafter, the steps of forming the first bump 110 on the first electrode 116 and the second bump 112 on the second electrode 118 respectively will be described.

(1) First Method of Fabricating the Bumps

Referring to FIGS. 5A to 5C and 6A to 6C, the steps of fabricating the first bump 110 and second bump 112 shown in FIG. 2A and FIG. 2B (the first fabrication method) will be described.

Figure 5A:
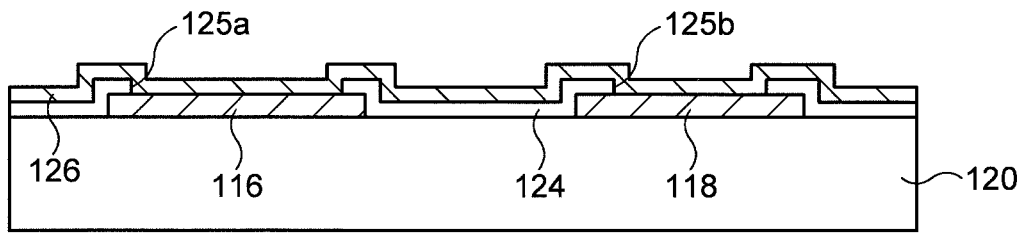
FIG. 5A shows a step of forming a first electrode, a second electrode, an insulating film, and a base metal film on a substrate in a method of manufacturing an LED module according to an embodiment of the present invention.

FIG. 5A shows the step in which the first electrode 116, the second electrode 118, an insulating film 124, and a base metal film 126 are disposed on the substrate 120. The first electrode 116 and the second electrode 118 are formed of a metal film such as aluminum (Al). The insulating film 124 is formed of a silicon oxide film, a silicon nitride film, or the like. The insulating film 124 is formed with openings 125a, 125b which expose the top surface of the first electrode 116 and the second electrode 118. Openings 125a, 125b are formed in the insulating film 124 to expose the upper surfaces of the first electrode 116 and the second electrode 118. The base metal film 126 is formed of a metal material such as titanium (Ti), nickel (Ni), and nickel-palladium (NiPd). For example, the base metal film 126 may be formed by laminating a titanium (Ti) film and a nickel-palladium (NiPd) film.

Figure 5B:
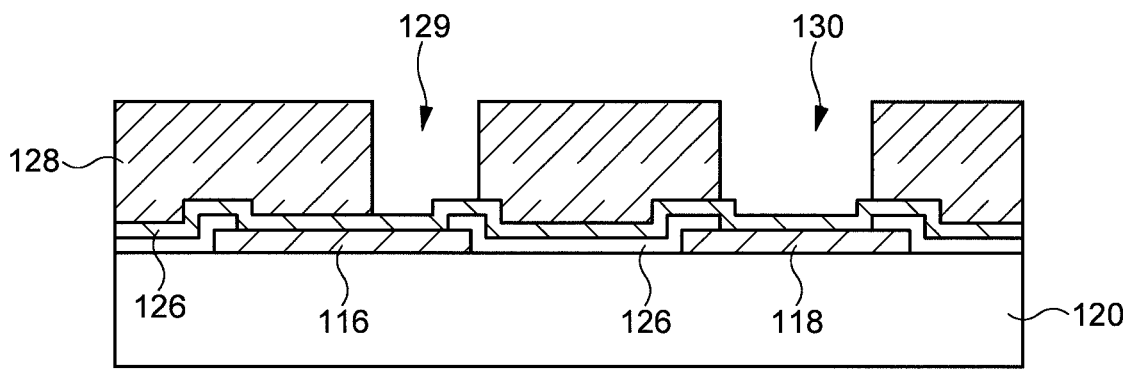
FIG. 5B shows a step of forming a first resist mask on the base metal film in a method of manufacturing an LED module according to an embodiment of the present invention.

FIG. 5B shows a step of forming a first resist mask 128 on the base metal film 126. The first resist mask 128, for example, has a thickness of about 20 to 70 μm and is formed of a so-called thick film resist. The first resist mask 128 forms a first opening 129 corresponding to the first electrode 116 and a second opening 130 corresponding to the second electrode 118. The second opening 130 is formed so that a central position overlaps the center of the second electrode 118. The center of the first opening 129 is formed away from the center of the first electrode 116 and closer to the second electrode 118 as shown in the diagram.

Figure 5C:
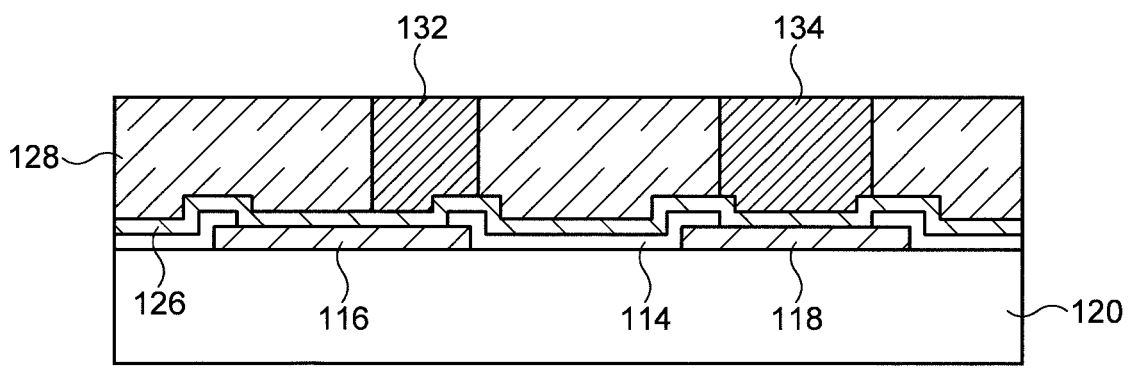
FIG. 5C shows a step of forming a first bump layer and a second bump layer in a method of manufacturing an LED module according to an embodiment of the present invention.

FIG. 5C shows the step of forming a first bump layer 132 and a second bump layer 134. The first bump layer 132 and the second bump layer 134 are formed of a low melting point metal material having a melting point of 300° C. or less, preferably 250° C. or less. For example, the first bump layer 132 and the second bump layer 134 are formed of solder. As the solder material, tin (Sn), a tin alloy (SnPb alloy, SnCu alloy, SnBi alloy, SnAg alloy, etc.) or an indium and tin alloy (InSn), etc., are used. The first bump layer 132 and the second bump layer 134 formed of such a low melting point metal material are made, for example, by a solder plating method. After the first bump layer 132 and the second bump layer 134 are formed, the first resist mask 128 is removed.

Figure 6A:
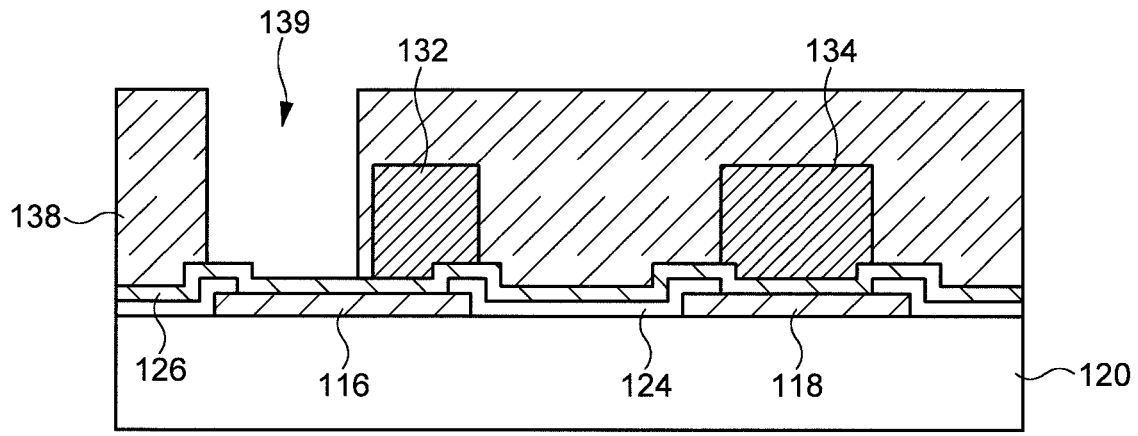
FIG. 6A shows a step of forming a second resist mask on the substrate in a method of manufacturing an LED module according to an embodiment of the present invention.

FIG. 6A shows a second resist mask 138 formed on the substrate 120. The second resist mask 138 is formed to cover the first bump layer 132 and the second bump layer 134 using a thick film resist similar to the first resist mask 128. The second resist mask 138 has a third opening 139, and the third opening 139 is formed in an area where the first bump layer 132 on the first electrode 116 is not formed.

As shown in FIG. 6A, a third bump layer 136 is formed. The third bump layer 136 is fabricated by the same process using the same low melting point metal material as the first bump layer 132 and the second bump layer 134.

Figure 6B:
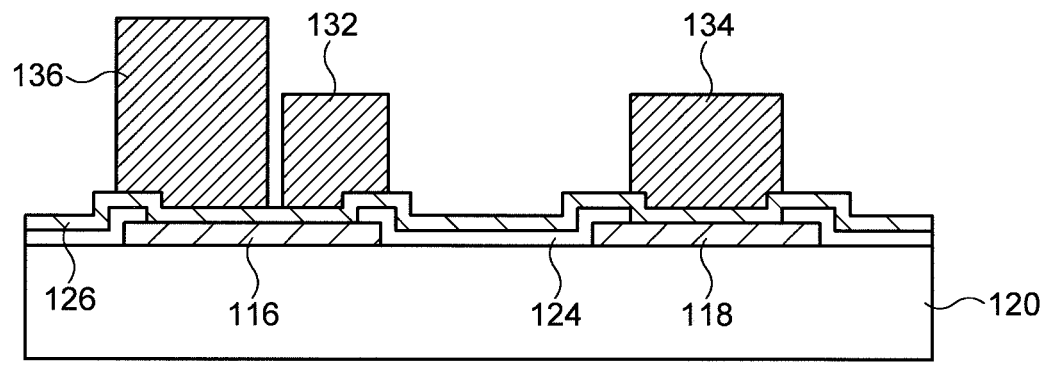
FIG. 6B shows a step in which the second resist mask is removed after the third bump layer is formed in a method of manufacturing an LED module according to an embodiment of the present invention.

FIG. 6B shows a step in which the second resist mask 138 is removed after the third bump layer 136 is formed. The third bump layer 136 is formed on the first electrode 116 adjacent to the first bump layer 132. The third bump layer 136 has a large thickness and width pattern relative to the first bump layer 132.

Heat treatment is performed to reflow the first bump layer 132, the second bump layer 134, and the third bump layer 136 shown in FIG. 6B. The first bump layer 132 and the third bump layer 136 are fluidized and integrated by the heat treatment. The first bump layer 132 and the third bump layer 136 are then shaped to have a spherical surface to form the first bump 110. In addition, the second bump layer 134 is shaped so that the second bump layer 134 has a spherical surface due to the reflow, and the second bump 112 is formed. The first bump 110 is formed to include the region of thickness d1 and the region of thickness d2 as described with reference to FIG. 2A, due to the thickness difference between the first bump layer 132 and the third bump layer 136.

Figure 6C:
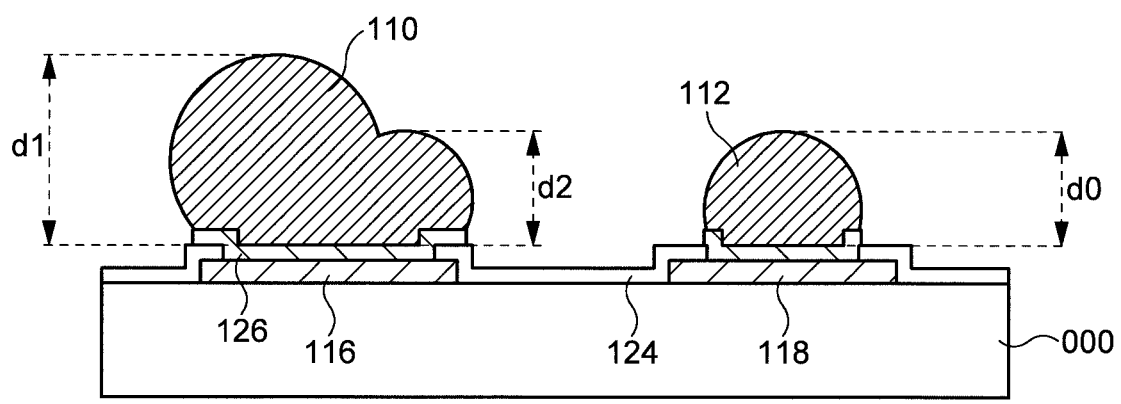
FIG. 6C shows a step in which a first bump is disposed on the first electrode and a second bump is disposed on the second electrode in a method of manufacturing an LED module according to an embodiment of the present invention.

Thereafter, as shown in FIG. 6C, an initial structure can be obtained in which the first bump 110 is formed on the first electrode 116 and the second bump 112 is formed on the second electrode 118 by etching the base metal film 126 using the first bump 110 and the second bump 112 as a mask.

Figure 7A:
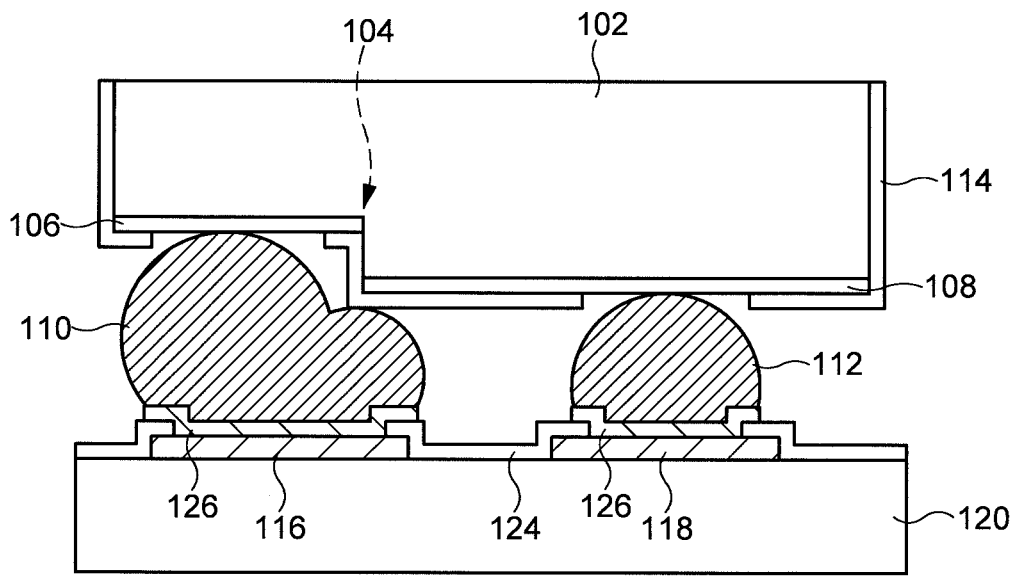
FIG. 7A shows a step for mounting an LED chip on the substrate in a method of manufacturing an LED module according to an embodiment of the present invention.
Figure 7B:
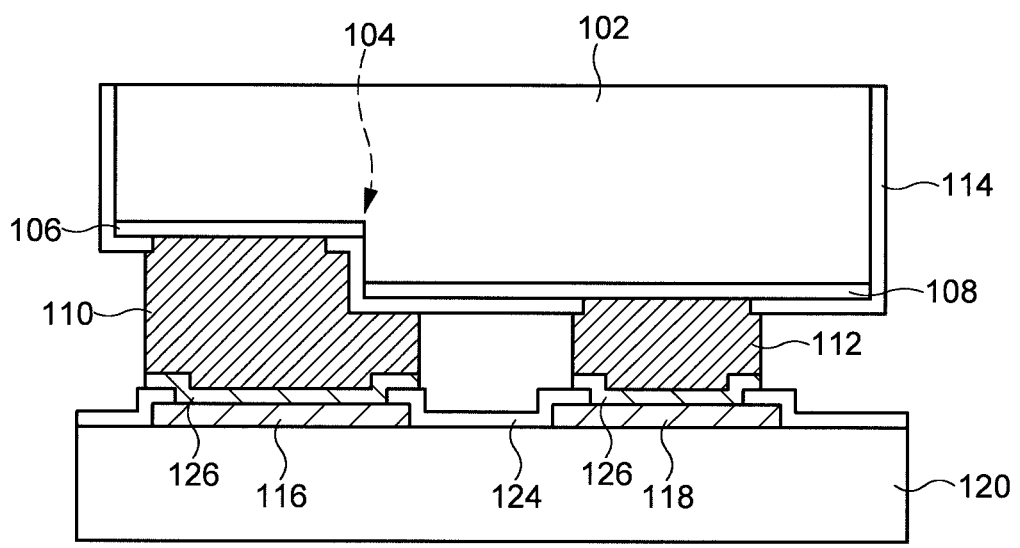
FIG. 7B shows a step of bonding the first bump and the second bump to a cathode electrode and an anode electrode of the LED chip in a method of manufacturing an LED module according to an embodiment of the present invention.

FIG. 7A shows the step of mounting the LED chip 102 on the substrate 120. The LED chip 102 is disposed on the first bump 110 and second bump 112 with the cathode electrode 106 and the anode electrode 108 facing the substrate 120. In this state, the first bump 110 and the second bump 112 are heated to a temperature equal to or higher than the melting point of the solder material. This heat treatment is accomplished, for example, by irradiation of a laser beam. As shown in FIG. 7B, the first bump 110 and the second bump 112 can be bonded to the cathode electrode 106 and the anode electrode 108 of the LED chip 102 by this process.

When a bump formed of solder is connected to an LED chip, if a void is formed in the bump, a failure in connection (disconnection) may occur. Although solder is used for connecting electronic circuits, it is known that breakage occurs due to creep fracture. When a void is contained in a bump formed of a solder material, a problem is caused in that the void grows due to the action of stress, and creep fracture easily occurs. However, as shown in the first bump 110 of the present embodiment, a shape of different thicknesses corresponding to the step portion 104 of the LED chip 102 can be pre-formed, thereby preventing the generation of voids during bonding by the heat treatment and preventing the occurrence of creep fracture.

According to the method of manufacturing the bumps shown in FIGS. 5A to 5C and 6A to 6C, two resist masks can be made, and two solder forming steps and subsequent reflow steps can cause the shape of the first bump 110 and the second bump 112 to be different in size and form a fused shape of two spherical (or hemispherical) bodies of different sizes in the first bump 110. Such a shape of the first bump 110 allows a stable connection structure to be formed without being affected by the step in the LED chip 102.

(2) Second Method of Fabricating the Bumps

Referring to FIGS. 8A to 8C and 9A to 9C, the steps of fabricating the first bump 110 and second bump 112 shown in FIG. 3A and FIG. 3B (the second fabrication method) will be described.

Figure 8A:
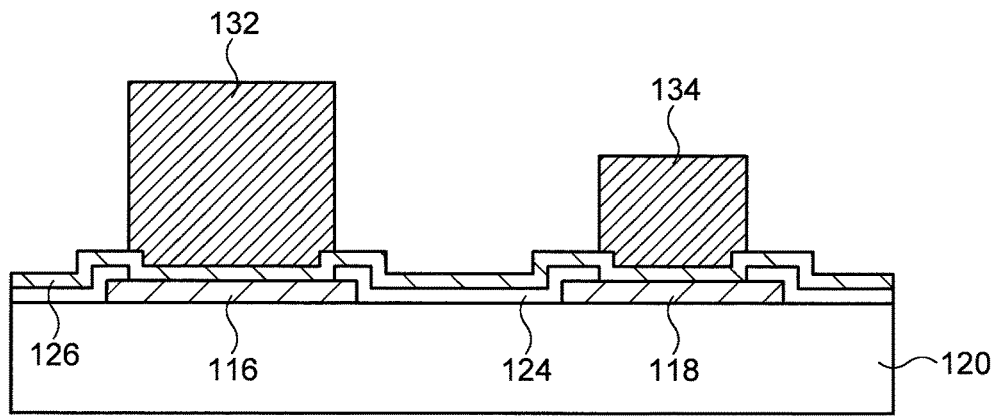
FIG. 8A shows a step of forming a first bump layer on the first electrode and a second bump layer on the second electrode through the base metal film on the first electrode in a method of manufacturing an LED module according to an embodiment of the present invention.

FIG. 8A shows a step in which a first bump layer 132 is formed over the first electrode 116 and a second bump layer 134 is formed over the second electrode 118 via the base metal film 126, respectively. The thicknesses of the first bump layer 132 and the second bump layer 134 are different. Preferably, the first bump layer 132 is formed thicker than the second bump layer 134. The first bump layer 132 and the second bump layer 134, which have different thicknesses, may be fabricated in a separate solder plating process. The method of forming the bump layer by solder plating is similar to the method described in the first fabrication method.

Figure 8B:
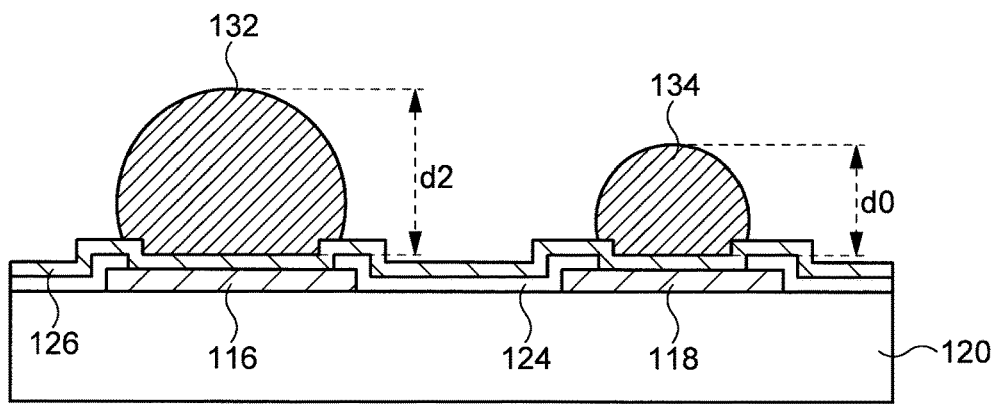
FIG. 8B shows a step of performing a heat treatment to reflow the first bump layer and the second bump layer in a method of manufacturing an LED module according to an embodiment of the present invention.

FIG. 8B shows the step of performing a heat treatment to reflow the first bump layer 132 and the second bump layer 134. The first bump layer 132 and the second bump layer 134 are reflowed to form a spherical surface. The first bump layer 132 is formed of a thickness d2 and the second bump layer 134 is formed of a thickness d0. The first bump layer 132 is formed larger with respect to the second bump layer 134 (d2>d0).

Figure 8C:
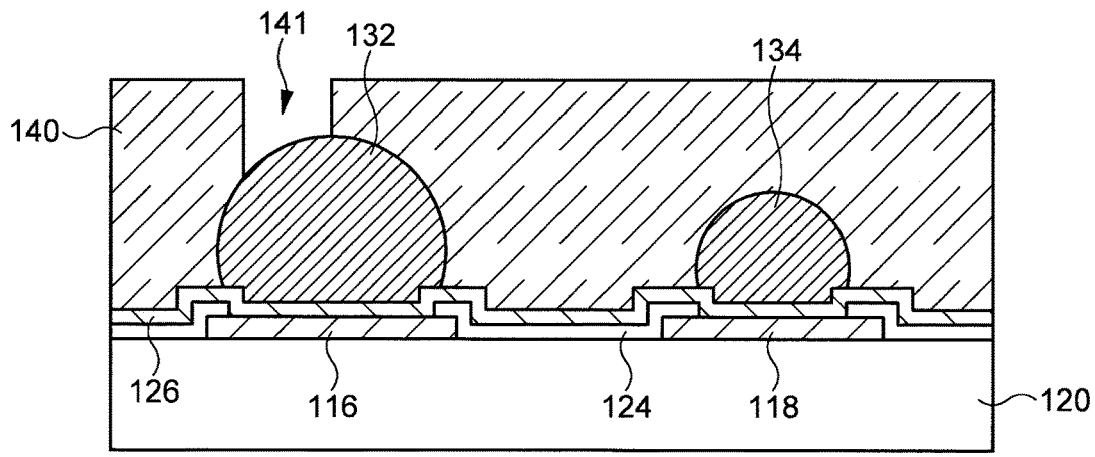
FIG. 8C shows a step of forming a fourth resist mask on the substrate in a method of manufacturing an LED module according to an embodiment of the present invention.

FIG. 8C shows the steps in which a fourth resist mask 140 is formed on the substrate 120. The fourth resist mask 140 is provided to cover the first bump layer 132 and the second bump layer 134 after reflowing and has a fourth opening 141 that exposes a portion of the upper end portion of the first bump layer 132.

Figure 9A:
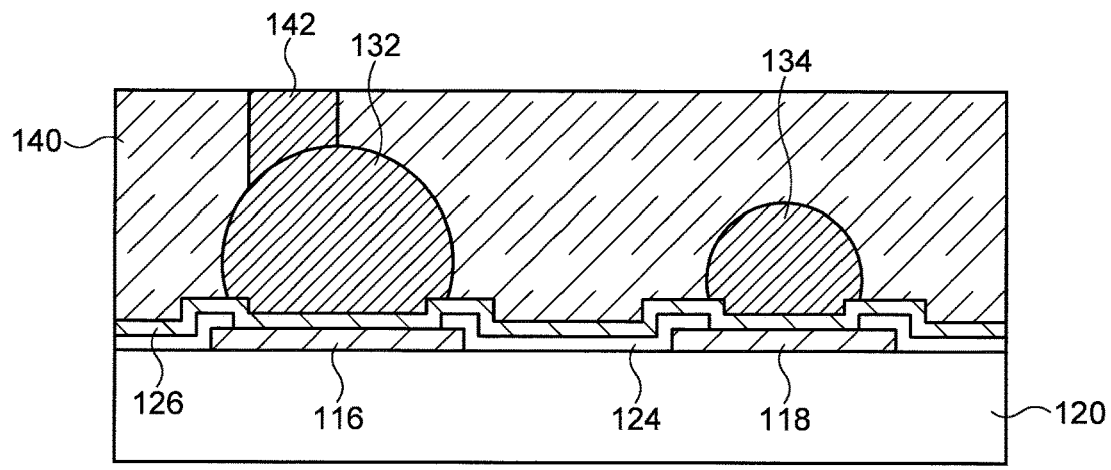
FIG. 9A shows a step of forming a fourth bump layer in a method of manufacturing an LED module according to an embodiment of the present invention.

FIG. 9A shows forming a fourth bump layer 142. The fourth bump layer 142 is formed to embed the fourth opening 141 of the fourth resist mask 140. The fourth bump layer 142 can be fabricated in the same manner using the same low melting point metal material as the first bump layer 132.

Figure 9B:
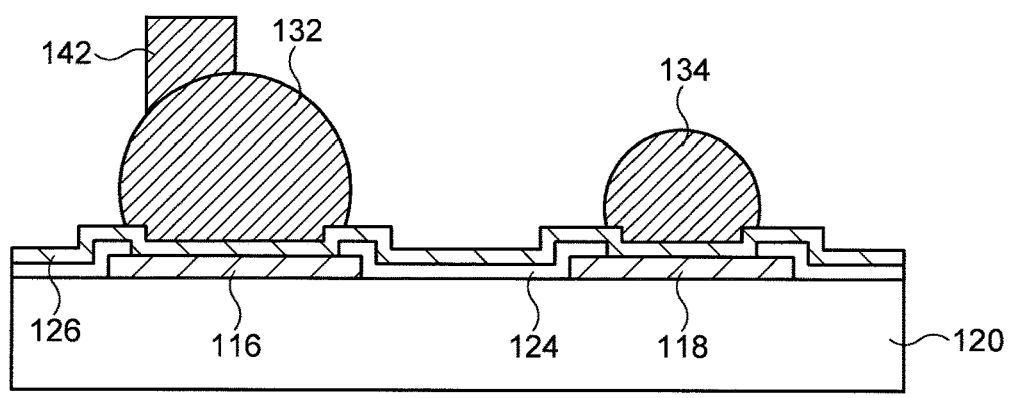
FIG. 9B shows a step of removing the fourth resist mask in a method of manufacturing an LED module according to an embodiment of the present invention.

FIG. 9B shows the step of removing the fourth resist mask 140. A structure is formed so that the fourth bump layer 142 protrudes over the first bump layer 132 by removing the fourth resist mask 140.

Figure 9C:
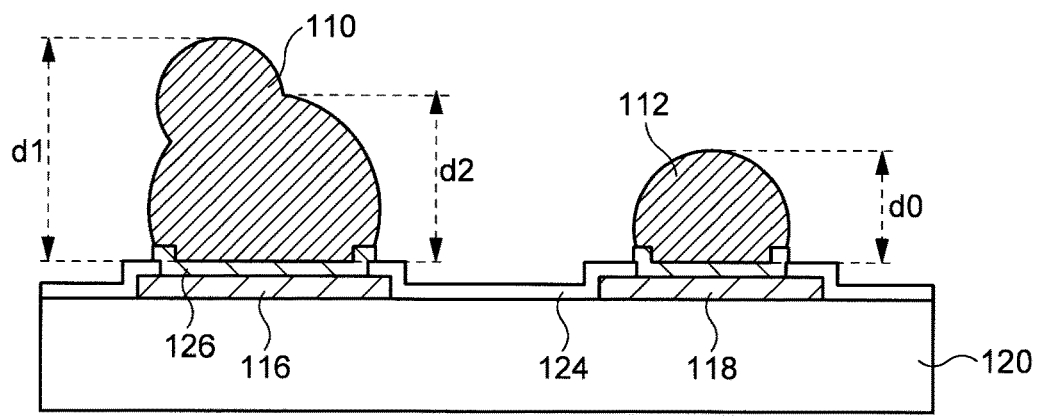
FIG. 9C shows a step of reflowing the fourth bump layer by a heat treatment in a method of manufacturing an LED module according to an embodiment of the present invention.

FIG. 9C shows a step in which the fourth bump layer 142 is reflowed by heat treatment. The reflow process forms a shape in which the fourth bump layer 142 having a spherical surface extends over the first bump layer 132. Such a process forms the first bump 110 and the second bump 112 in the shape shown in FIG. 3A. The first bump 110 has a structure including a region having a large film thickness d1 and a region having a small film thickness d2 relative to the film thickness d1. The base metal film 126 is etched with the first bump 110 and the second bump 112 as a mask.

According to the method of manufacturing the bumps shown in FIGS. 8A to 8C and 9A to 9C, three resist masks forming steps, three solder layer forming steps, and two subsequent reflow steps can be performed to cause the shape of the first bump 110 and the second bump 112 to differ and to form a fused shape of two spherical (or hemispherical) bodies of different sizes in the first bump 110. Such a shape of the first bump 110 allows a stable connection structure to be formed without being affected by the step in the LED chip 102.

(3) Third Method of Fabricating the Bumps

Referring to FIGS. 10A to 10C and 11A to 11C, a method of fabricating the first bumps 110 and the second bumps 112 shown in FIG. 4A (the third fabrication method) will be described. In the following explanation, descriptions that overlap with the first fabrication method are omitted as appropriate.

Figure 10A:
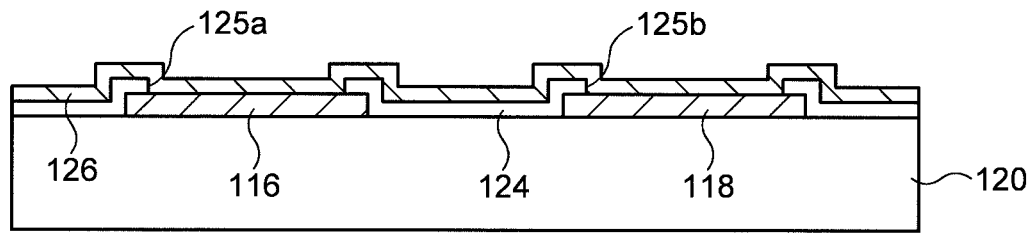
FIG. 10A shows a step of forming a first electrode, a second electrode, an insulating film, and a base metal film on a substrate in a method of manufacturing an LED module according to an embodiment of the present invention.

FIG. 10A shows the step in which the first electrode 116, the second electrode 118, the insulating film 124, and the base metal film 126 are disposed on the substrate 120. The configuration of the first electrode 116 and the second electrode 118, the insulating film 124, and the base metal film 126 is similar to that described with reference to FIG. 5A.

Figure 10B:
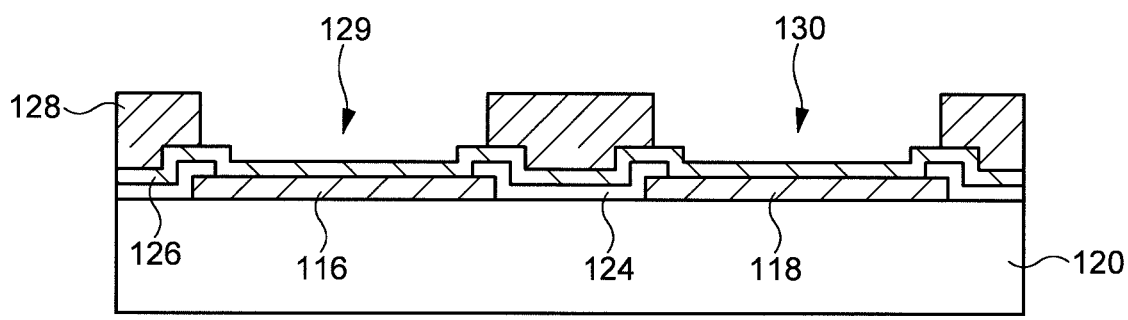
FIG. 10B shows a step of forming a first resist mask on the base metal film in a method of manufacturing an LED module according to an embodiment of the present invention.

FIG. 10B shows a step in which the first resist mask 128 is formed on the base metal film 126. The first resist mask 128 has the first opening 129 and the second opening 130 sized to expose the top surface of the area where the base metal film 126 overlaps the first electrode 116 and the second electrode 118, respectively.

Figure 10C:
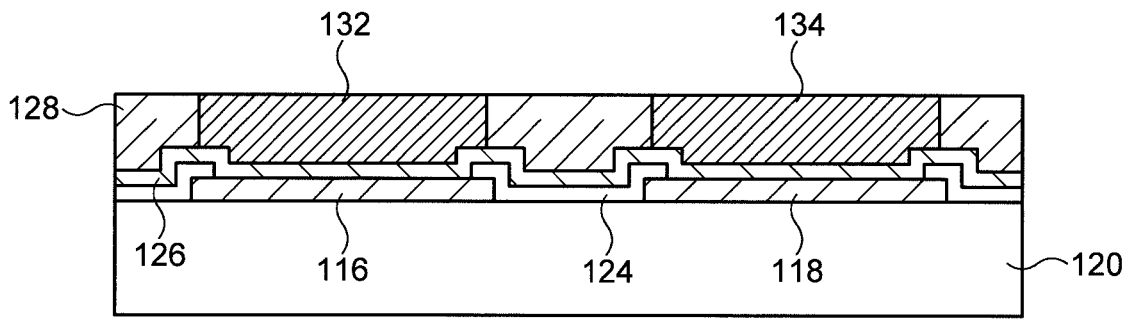
FIG. 10C shows a step of forming a first bump layer and a second bump layer in a method of manufacturing an LED module according to an embodiment of the present invention.

FIG. 10C shows the step of forming the first bump layer 132 and the second bump layer 134. The first bump layer 132 and the second bump layer 134 are formed of a low melting point metal material having a melting point of 300° C. or less, preferably 250° C. or less. After the first bump layer 132 and the second bump layer 134 are formed, the first resist mask 128 is removed.

Figure 11A:
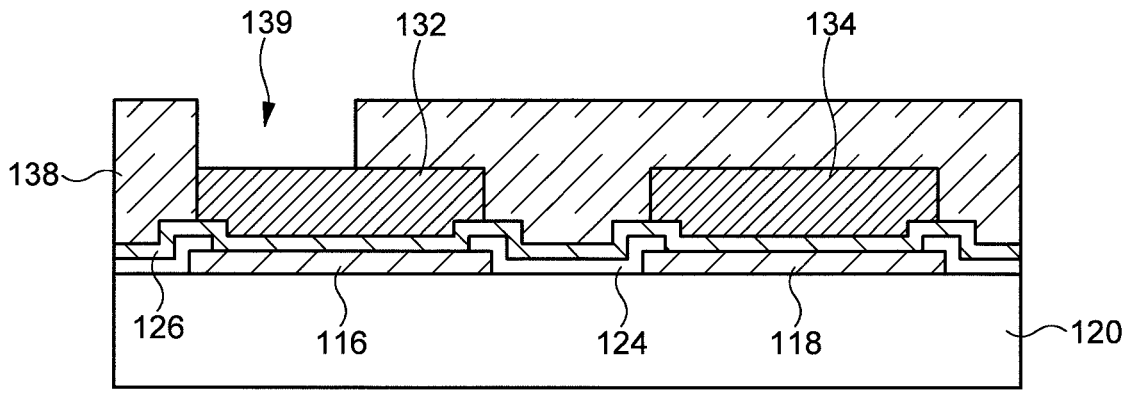
FIG. 11A shows a step of forming a second resist mask on the substrate in a method of manufacturing an LED module according to an embodiment of the present invention.

FIG. 11A shows the step whereby the second resist mask 138 is formed on the substrate 120. The second resist mask 138 is formed over a portion of the first bump layer 132 and the second bump layer 134. The second resist mask 138 is provided with the third opening 139 that exposes a portion of the upper surface of the first bump layer 132.

Figure 11B:
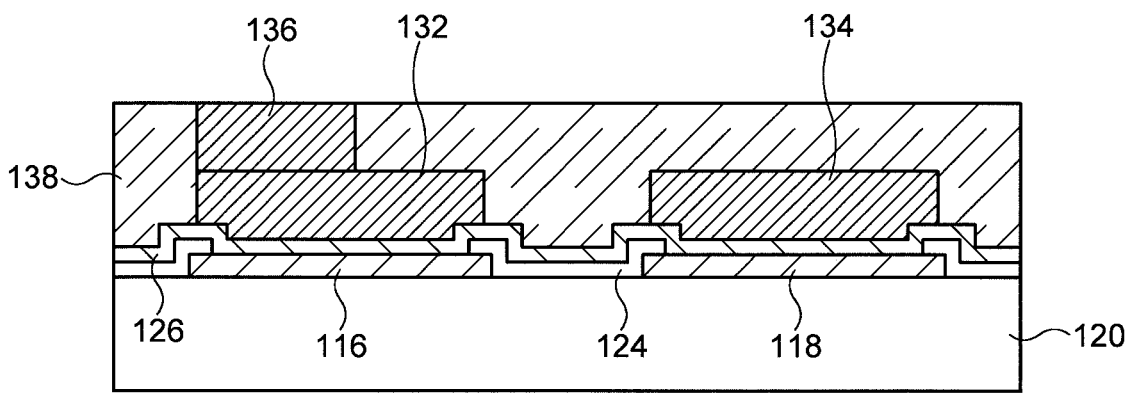
FIG. 11B shows a step of forming a third bump layer in a method of manufacturing an LED module according to an embodiment of the present invention.

FIG. 11B shows a step in which the third bump layer 136 is formed. The third bump layer 136 is formed to embed the third opening 139 of the second resist mask 138. The third bump layer 136 is fabricated by the same process using the same low melting point metal material as the first bump layer 132 and the second bump layer 134.

Figure 11C:
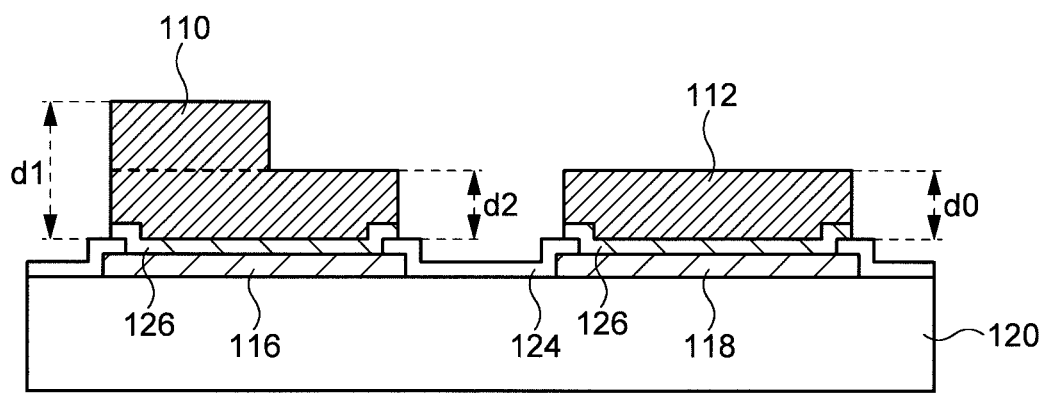
FIG. 11C shows a step of removing the second resist mask and etching the base metal film in a method of manufacturing an LED module according to an embodiment of the present invention.

FIG. 11C shows the state whereby the second resist mask 138 is removed and the base metal film 126 is further etched. The first bump 110 has a step portion and has a shape including regions having different film thicknesses. That is, the first bump 110 has a step portion in a cross-sectional view as shown in FIG. 2B and has a region of thickness d1 and a region of thickness d2 (d1>d2). On the other hand, the second bump 112 is formed of a constant thickness d0. This thickness d0 has the same thickness as the thickness d2 of the first bump 110 (d0=d2).

According to the method of manufacturing the bumps shown in FIGS. 10A to 100 and 11A to 11C, two resist masks forming steps and two solder forming steps can be performed to cause the shape of the first bump 110 and the second bump 112 to differ, and the first bump 110 may comprise at least two regions with different film thicknesses. Such a shape of the first bump 110 allows a stable connection structure to be formed without being affected by the step in the LED chip 102.

The first fabrication method, the second fabrication method, and the third fabrication method for bumps shown in this section require at least two resist mask fabrication steps and at least two solder film fabrication steps, which can be deployed on a large area substrate and can be processed uniformly over a wide area. For example, the bump fabrication process shown in this section can be applied to the pixel region of the micro LED display.

3. Display Device

A configuration of a display device according to an embodiment of the present invention is shown. The display device according to this embodiment has a structure in which the pixel is disposed with LED chip(s). The pixel has a structure in which the LED chip(s) is connected to a first electrode and a second electrode formed on a circuit board called a backplane by the bumps shown in FIG. 1A and FIG. 1B. That is, the display device shown in this embodiment has a structure in which the LED chip(s) is mounted in the same structure as the mounting structure of the LED and the module shown in FIG. 1.

Figure 12:
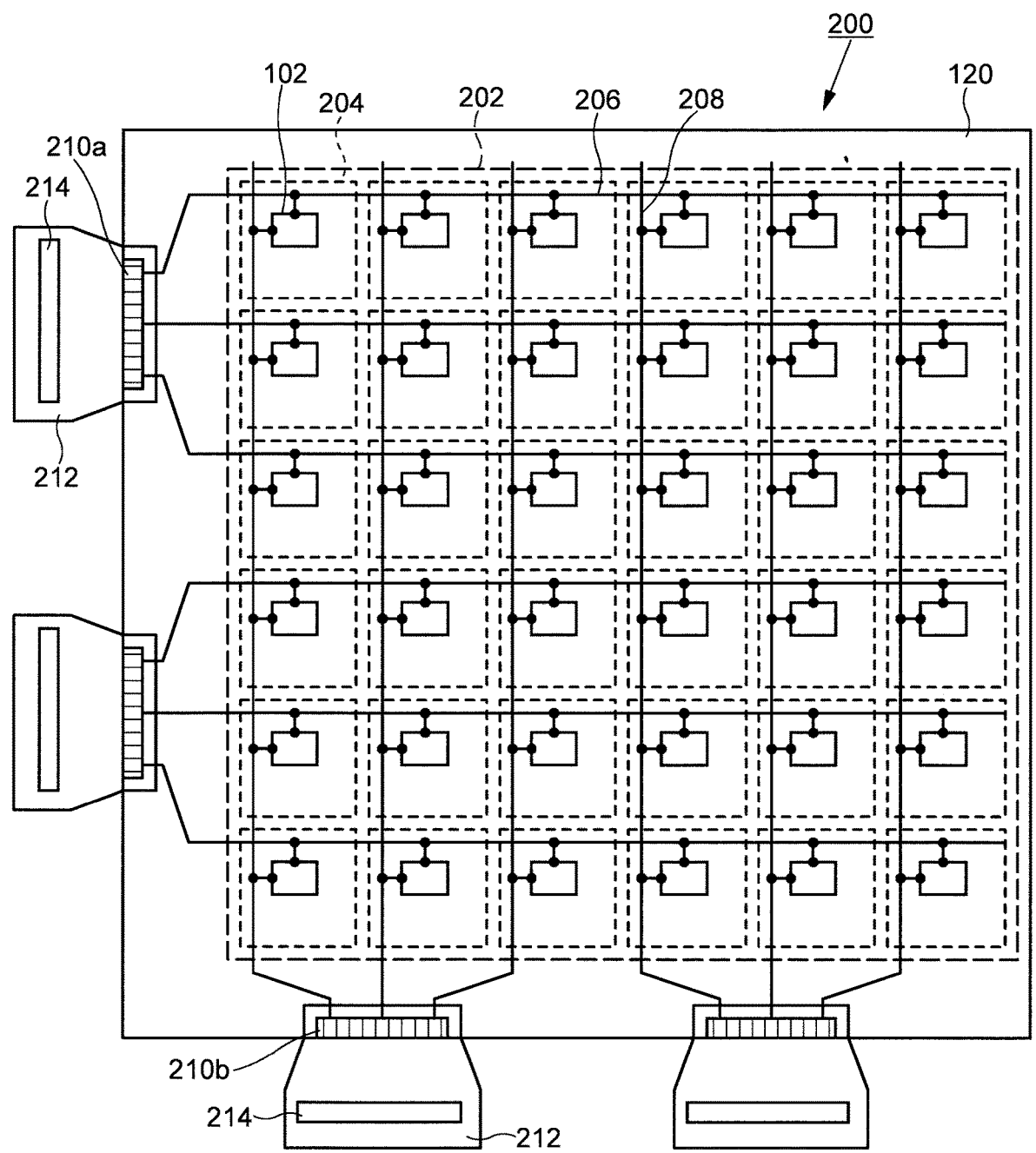
FIG. 12 shows a configuration of a display device according to an embodiment of the present invention.

FIG. 12 shows the configuration of the display device 200 according to the present embodiment. The display device 200 has a display unit 202 on the substrate 120 in which a plurality of pixels 204 are disposed in a matrix. Each of the plurality of pixels 204 is mounted with the LED chip(s) 102. For each pixel, LED chip 102 with different wavelengths of light emitted may be suitably implemented. For example, the plurality of pixels 204 may include pixels in which an LED chip emitting red light is mounted, pixels in which an LED chip emitting green light is mounted, and pixels in which an LED chip emitting blue light is appropriately mounted. In addition, as a color filter type display device, an LED chip emitting white light may be mounted on each pixel, or an LED chip emitting blue or ultraviolet light as a quantum dot display may be mounted on each pixel.

A scanning signal line 206 for inputting a scanning signal into the pixel 204 and a data signal line 208 for inputting an image signal are disposed in the display unit 202. The scanning signal line 206 and the data signal line 208 are disposed to intersect. The periphery of the substrate 120 is disposed with an input terminal 210a of the scan signal line 206 and an input terminal 210b of the data signal line 208. The input terminals 210a, 210b are connected to a flexible printed wiring board 212. A driver IC 214 may be mounted on the flexible printed wiring board 212.

Figure 13:
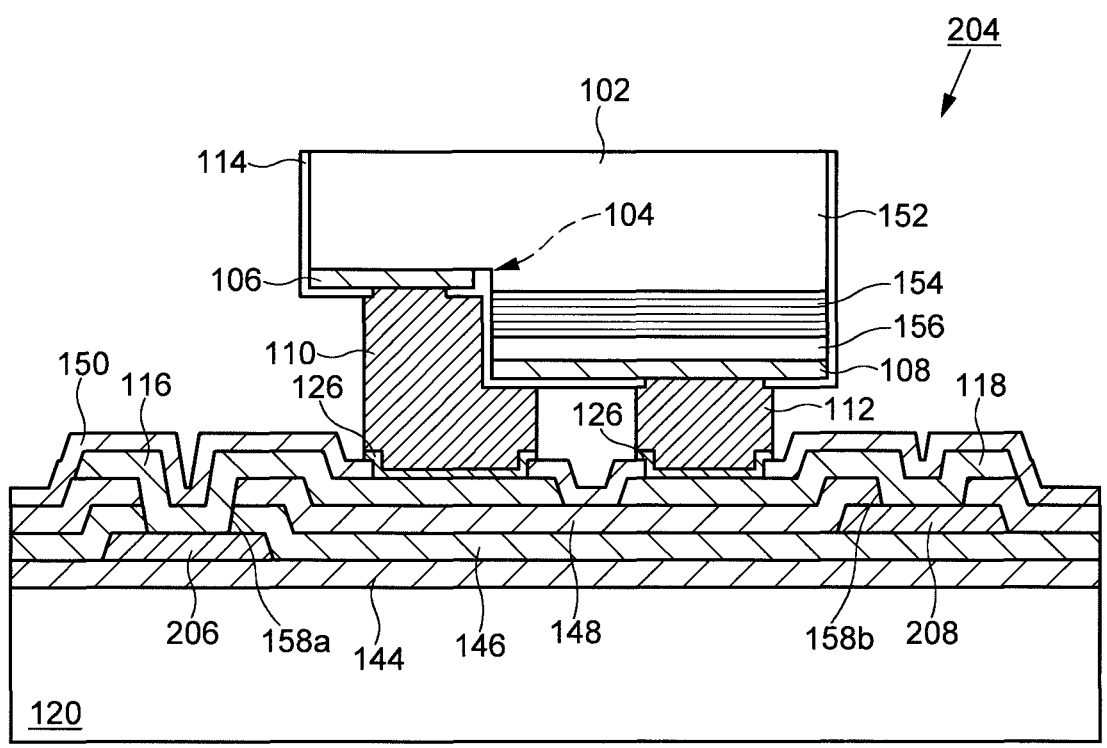
FIG. 13 shows a cross-sectional structure of a pixel of a display device according to an embodiment of the present invention.

FIG. 13 shows an example of a cross-sectional structure of pixel 204. The pixel 204 has a structure in which the first insulating layer 144, the second insulating layer 146, the third insulating layer 148, and the fourth insulating layer 150 are laminated and a data signal line 208 is provided between the first insulating layer 144 and the second insulating layer 146 and between the second insulating layer 146 and the third insulating layer 148.

The first electrode 116 and the second electrode 118 are disposed on the third insulating layer 148. The first electrode 116 is also electrically connected to the scanning signal line 206 from the first contact hole 158a passing through the second insulating layer 146 and the second insulating layer 146, and the second electrode 118 is electrically connected to the data signal line 208 by a second contact hole 158b passing through the third insulating layer 148. The fourth insulating layer 150 is disposed on the top layer side of the first electrode 116 and the second electrode 118. The first electrode 116 and second electrode 118 are exposed by openings formed in the fourth insulating layer 150 at locations where the first bumps 110 and the second bumps 112 are disposed.

The LED chip 102 includes an n-type semiconductor layer 152, an active layer 154, and a p-type semiconductor layer 156 formed of a semiconductor material such as gallium nitride. In the LED chip 102, the cathode electrode 106 is disposed on a region in which the p-type semiconductor layer 156 and the active layer 154 are removed, and the anode electrode 108 is disposed on the p-type semiconductor layer 156.

The LED chip 102 is disposed on the first electrode 116 and the second electrode 118. The LED chip 102 is electrically connected to the first electrode 116 by the first bump 110 and the anode is electrically connected to the second electrode 118 by the second bump 112. The base metal film 126 may be disposed between the first bump 110 and the first electrode 116 and between the second bump 112 and the second electrode 118.

As shown in FIG. 13, the LED chip 102 can be horizontally mounted on the first electrode 116 and the second electrode 118 by having regions of different thickness and being provided to embed step portion 104. Also, the contact area between the cathode electrode 106 and the first bump 110 can be increased to form a stable mounting structure. That is, the first bump 110 can embed step portion 104 in the LED chip 102 by having regions of different thickness, ensuring the area of contact with the first electrode 116 and holding the LED chip 102 horizontally.

Here, the first bump 110 and the second bump 112 may be applied as initial structures prior to mounting the LED chips 102 in the structures shown in FIG. 2A and FIG. 2B, FIG. 3A and FIG. 3B, and FIG. 4A and FIG. 4B. In addition, the first electrode 116 having the structure shown in FIG. 4C can be applied. The display device can be manufactured by applying the manufacturing method shown in FIGS. 5A to 5C, 6A to 6C, and 7A to 7B, the manufacturing method shown in FIGS. 8A to 8C and 9A to 9C, and manufacturing method shown in FIGS. 10A to 10C and 11A to 11C, as the manufacturing method of the first bump 110 and the second bump 112.

Although FIG. 13 shows an example of a passive matrix type display device 200, the present embodiment is not limited thereto, and may also be applied to an active matrix type display device in which the emission of individual pixels is controlled by a pixel circuit using a transistor.

Figure 14A:
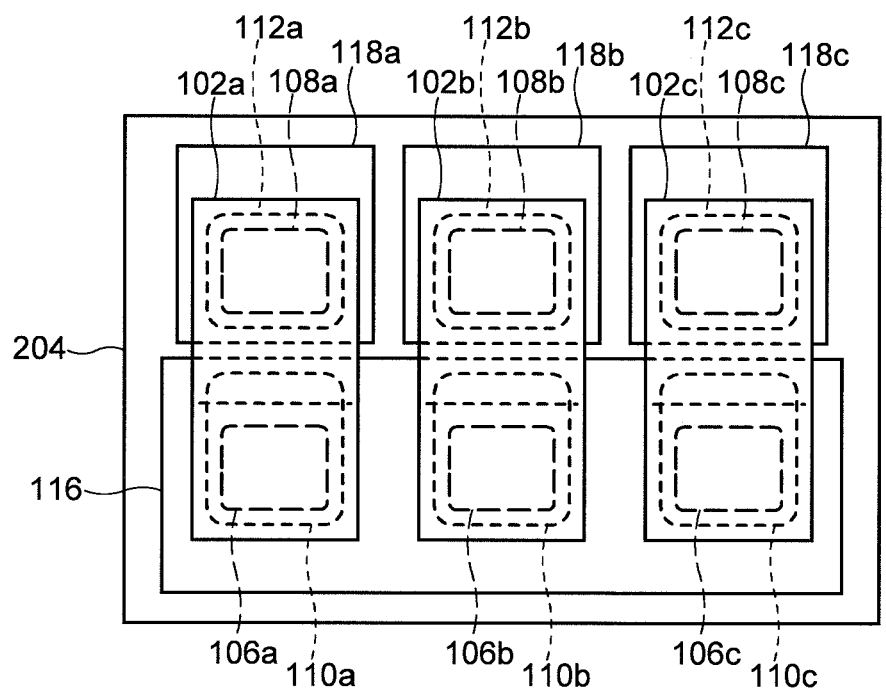
FIG. 14A shows an example of the arrangement of an LED chip, a first electrode, and a second electrode in a pixel of a display device according to an embodiment of the present invention.
Figure 14B:
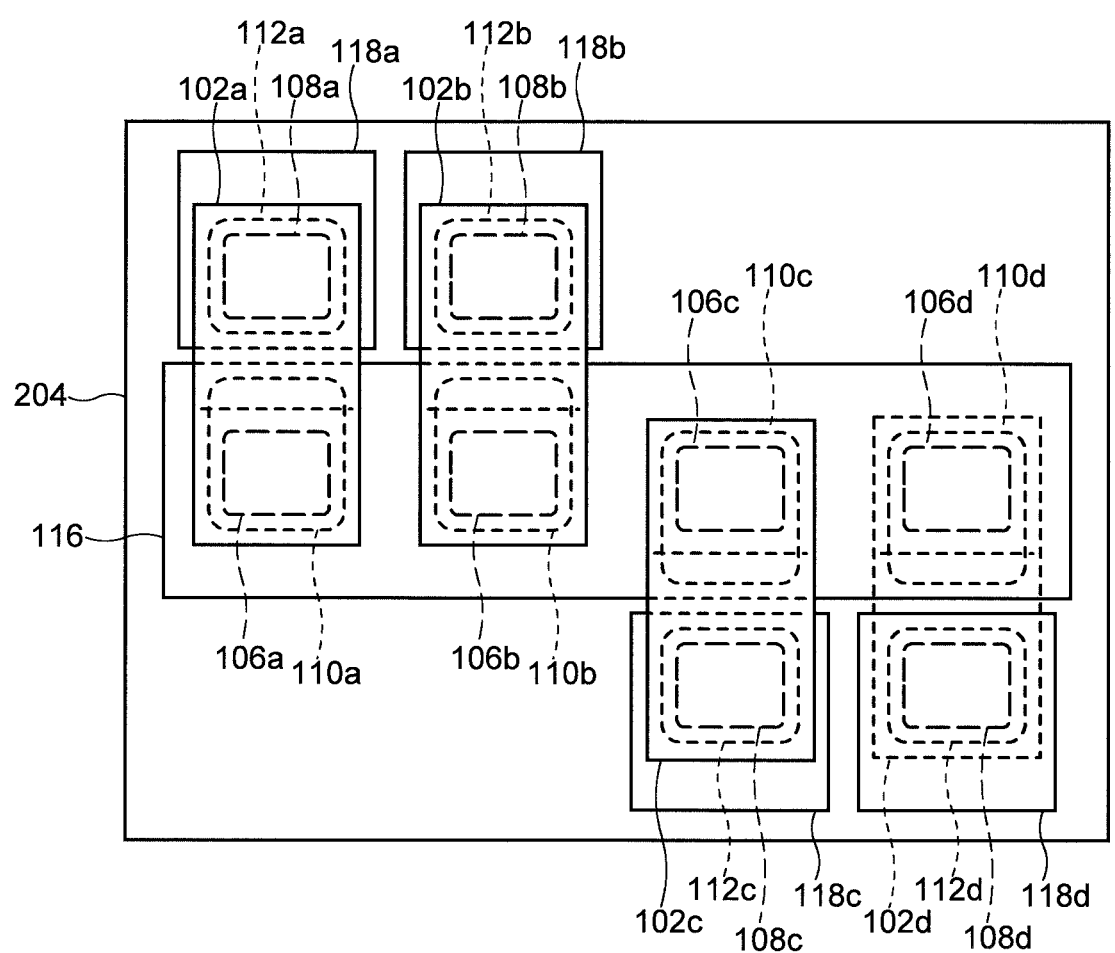
FIG. 14B shows an example of the arrangement of an LED chip, a first electrode, and a second electrode in a pixel of a display device according to an embodiment of the present invention.

FIG. 14A and FIG. 14B show an example of the arrangement of a plurality of LED chips 102, the first electrode 116, and the second electrodes 118 (118a, 118b, 118c) in the pixel 204. FIG. 14A shows an example in which a first LED chip 102a, a second LED chip 102b, and a third LED chip 102c are disposed on the pixel 204. Each of these LED chips emits light in a different wavelength band. For example, the first LED chip 102a emits light in a wavelength band corresponding to red, the second LED chip 102b emits light in a wavelength band corresponding to green, and the third LED chip 102c emits light in a wavelength band corresponding to blue. When such LED chips 102 are mounted on a pixel 204, the first electrode 116 connected to the cathode electrodes 106 (106a, 106b, 106c) is provided in common, and the second electrodes 118 (118a, 118b, 118c) connected to the anode electrodes 108 (108a, 108b, 108c) can be disposed corresponding to each LED chip 102. The first bumps 110a, 110b, 110c, and the second bumps 112a, 112b, 112c are disposed for each LED chip 102. According to the structure of the pixel 204, the shape of the electrodes can be simplified and the mounting position of the LED chips 102 can be made redundant by providing the first electrode 116 with a wide width, and the manufacturing yield can be improved.

FIG. 14B shows an example in which a spare second electrode 118 (118a, 118b, 118c, 118d) is disposed in pixel 204. The preliminary second electrode 118d is disposed adjacent to the first electrode 116. The second electrode 118d may be used for repair in the event of a defect in the LED chip within the pixel 204. For example, the first electrode 116 and the second electrode 118d may be mounted with an LED chip 102d for repair. The second electrodes 118 may also be disposed on both sides such that the first electrode 116 is sandwiched.

The structure of pixel 204 shown in FIG. 13, FIG. 14A, and FIG. 14B can be applied to a display device that installed with a mini LED chip or a micro LED chip. Even when a bare chip having a different height between the cathode and the anode is used as the LED chip, the bumps (the first bumps 110 and the second bumps 112) shown in this embodiment can be used to secure the stability of the connection and improve the reliability.

Based on the pixel structure of the display device described above as one embodiment of the present invention, a pixel structure that can be appropriately redesigned and implemented by a person skilled in the art is also within the scope of the present invention as long as the subject matter of the present invention is included.

Within the scope of the concept of the present invention, a person skilled in the art will be able to come up with various modifications and modifications, which also fall within the technical scope of the present invention. For example, in one embodiment of the present invention described above, additions, deletions, and modifications made by a person skilled in the art as appropriate, and additions, omissions, and changes in conditions of steps are also within the scope of the present invention unless they depart from the scope of the present invention.

It is also to be understood that the operation and effect brought about by the embodiment described in one embodiment of the present invention will be naturally brought about by the present invention if it is obvious from the description of the present invention or if one skilled in the art can reasonably think conceive of such operations and effects.

Supplemental Description

Although all or part of the exemplary embodiments disclosed in this specification may be described in the following supplemental description, one embodiment of the invention is not limited thereto.

Supplemental description 1. A display device in an embodiment according to the present invention includes:
 a first electrode and a second electrode disposed on a pixel;
 at least one LED chip disposed on the first electrode and the second electrode; and
 a first bump between the at least one LED chip and the first electrode, and a second bump between the at least one LED chip and the second electrode,
 wherein
 the at least one LED chip includes a cathode electrode facing the first electrode, an anode electrode facing the second electrode, and a step portion between the cathode electrode and the anode electrode,
 a distance between the first electrode and the cathode electrode is larger than a distance between the second electrode and the anode electrode, and
 the first bump is disposed to embed the step portion.

Supplemental description 2. The display device according to supplemental description 1, wherein the first bump is disposed from a low portion to a high portion of the step portion.

Supplemental Description 3. The display device according to supplemental description 1, wherein the first electrode has a stepped shape in a cross-sectional view.

Supplemental description 4. A method for manufacturing LED module, the method includes:
 forming a first bump on a first electrode and a second bump on a second electrode on a pixel;
 disposing an LED chip on the first bump and the second bump; and
 heating the first bump and the second bump to electrically connect the LED chip to the first electrode and the second electrode,
 wherein the LED chip has a step portion on a surface facing the first bump and the second bump, and the first bump is formed to fill the step portion.

Supplemental description 5. The method according to supplemental description 4, wherein the formation of the first bump and the second bump includes:

forming a first bump layer on the first electrode; forming a second bump layer on the second electrode; and forming a third bump layer on the first electrode at a position opposite to the second bump layer side of the first bump layer, wherein the third bump layer is formed thicker than the first bump layer.

Supplemental description 6. The method according to supplemental description 4, wherein the formation of the first bump and the second bump includes:

forming a first bump layer on the first electrode; forming a second bump layer on the second electrode; and forming a third bump layer on the first bump layer at a position opposite to the second bump layer side of the first bump layer.

Supplemental description 7. The method according to supplemental description 5, wherein a first heat treatment is performed after the first bump layer and the second bump layer are formed, and the first bump and the second bump are reflowed, and a second heat treatment is performed after the second bump layer is formed, and the third bump layer is reflowed.

Supplemental description 8. The method according to supplemental description 5, wherein the formation of the first bump and the second bump includes:

forming a first bump layer on the first electrode;

forming a second bump layer on the second electrode; and forming a third bump layer in a region of a part of the first bump layer, wherein the third bump layer is formed to be positioned on the side opposite to the second bump layer side.

Supplemental description 9. The method according to supplemental description 4, wherein the formation of the first bump and the second bump includes:

forming a first bump layer on the first electrode; and forming a second bump layer on the second electrode, wherein the first bump layer is formed to have a tapered upper surface, and the second bump layer is formed to have a flat upper surface.

What is claimed is:

1. A circuit board, comprising: a first electrode for connecting a cathode electrode of an LED; a second electrode for connecting an anode electrode of the LED; a first bump disposed on the first electrode; and a second bump disposed on the second electrode, wherein the shapes of the first bump and the second bump are different, wherein the first bump includes a first spherical body and a second spherical body on the first electrode, each of the first spherical body and the second spherical body is in direct contact with the first electrode, a height of the first spherical body from a top surface of the first electrode is smaller than a height of the second spherical body from the top surface of the first electrode, and the first bump has a shape in which the first spherical body and the second spherical body are fused.

2. The circuit board according to claim 1, wherein the first spherical body is disposed close to the second bump.

3. The circuit board according to claim 1, wherein the height of the first spherical body of the first bump is equal to a height of the second bump.

* * * * *